(12) United States Patent
Yamauchi

(10) Patent No.: US 6,894,913 B2
(45) Date of Patent: May 17, 2005

(54) NON-VOLATILE SEMICONDUCTOR MEMORY AND METHOD OF OPERATING THE SAME

(75) Inventor: Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 212 days.

(21) Appl. No.: 10/315,095

(22) Filed: Dec. 10, 2002

(65) Prior Publication Data

US 2003/0117845 A1 Jun. 26, 2003

(30) Foreign Application Priority Data

Dec. 17, 2001 (JP) .................................... 2001-383170

(51) Int. Cl.[7] .............................................. G11C 5/02
(52) U.S. Cl. .......................................... 365/51; 365/63
(58) Field of Search ................................... 365/51, 63

(56) References Cited

U.S. PATENT DOCUMENTS 4,267,632 A  *  5/1981  Shappir

2003/0124803 A1  *  7/2003  Ueda et al.
2004/0109355 A1  *  6/2004  Yamauchi

FOREIGN PATENT DOCUMENTS

JP          1-130570 A       5/1989
JP          6-181298 A       6/1994

OTHER PUBLICATIONS

Kume et al; A 1.28m2 Contactless Memory Cell Technology for a 3V–Only 64Mbit EEPROM; IEDM 92, pp. 991–993, 1992.*

* cited by examiner

Primary Examiner—Anh Phung
Assistant Examiner—Hien Nguyen
(74) Attorney, Agent, or Firm—Nixon & Vanderhye, P.C.

(57) ABSTRACT

A method of writing data into a non-volatile semiconductor memory having a plurality of memory cells in which a word line is shared by memory cells and a bit line is shared by adjacent memory cells, the method including writing the data into memory cells connected to the same word line sequentially from a memory cell at one end to a memory cell at another end.

16 Claims, 8 Drawing Sheets

Source to source w/ source separation

Drain to drain w/ source separation

Odd No of cells in a segment

NON-VOLATILE SEMICONDUCTOR MEMORY AND METHOD OF OPERATING THE SAME

CROSS-REFERENCE TO RELATED APPLICATION

This application is related to Japanese Patent Application No. 2001-383170 filed on Dec. 17, 2001, whose priority is claimed under 35 USC §119, the disclosure of which is incorporated by reference in its entirety.

BACKGROUND OF THE INVENTION

1. Field of the Invention

The present invention relates to a non-volatile semiconductor memory and a method of operating the memory. More particularly, the invention relates to a non-volatile semiconductor memory which can be highly integrated and has cells of a contactless structure, and a method of operating the memory.

2. Description of Related Art

In a rewritable non-volatile NOR-type memory array of prior art, as shown in FIG. 14, each cell transistor 15 is formed in an active region defined by a field oxide film 16. The transistor 15 is composed of a source 11/drain 12, a floating gate 17 formed on the active region between the source 11/drain 12, and a control gate 10 formed on the floating gate 17 and connected to a word line perpendicular to a channel direction between the source 11/drain 12. In this memory cell array, the drain 12 is connected to a bit line 14 via a contact 13.

Thus the contact 13 formed on the drain 12 occupies a large part of a cell area and prevents the reduction of the cell area.

There is proposed a contactless memory array which is not provided with a contact for connecting the source/drain with the bit line, as shown in FIG. 15. In this memory cell array, a bit line 20 is formed as an impurity diffusion region which also functions as the source/drain.

However, in this memory array, since a word line 17 is arranged in the same direction as the channel direction of a cell transistor 18, a cell current at reading is affected by an adjacent cell on the same word line 17. Accordingly, even if a specific one of a plurality of cells on the same word line is written and the threshold of the specific cell is accurately controlled, the following problems arise:

(1) If the threshold of an adjacent cell on a source side changes from a low value to a high value, an apparent source resistance increases and the threshold of the specific cell shifts from its original value to a higher value.

(2) If the threshold of an adjacent cell on a source side changes from a high value to a low value, an apparent source resistance decreases and the threshold of the specific cell shifts from its original value to a lower value.

SUMMARY OF THE INVENTION

In view of the above-mentioned problems, an object of the present invention is to provide a non-volatile semiconductor memory allowing, in a plurality of cells arranged in the same word line, accurate control on the threshold after rewriting without being dependant upon the state of adjacent cells, and a method of operating the memory.

The present invention provides a method of writing data into a non-volatile semiconductor memory having a plurality of memory cells in which a word line is shared by memory cells and a bit line is shared by adjacent memory cells, the method comprising writing the data into memory cells connected to the same word line sequentially from a memory cell at one end to a memory cell at another end.

The present invention also provides a non-volatile semiconductor memory comprising a plurality of memory cells arranged in matrix, of which those aligned in a row direction are divided into two or more segments, wherein gates of the memory cells aligned in the row direction are connected to the same word line, sources and drains of memory cells aligned in a column direction are connected to the same bit lines, respectively, in the same segment, bit lines are shared by memory cells adjacent in the row direction, respectively, and the bit lines in each segment are electrically separated from the bit lines in other segment.

The present invention provides a method of writing a non-volatile semiconductor memory as the above, wherein only one-bit data is written in two segments or three segments at the same time.

The present invention provides a method of writing data in the above-described non-volatile semiconductor memories, wherein data is written by channel hot electrons.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Now the non-volatile semiconductor memory and its operation method of the present invention are described in detail by way of example with reference to the attached drawings.

EXAMPLE 1

Figure 1:
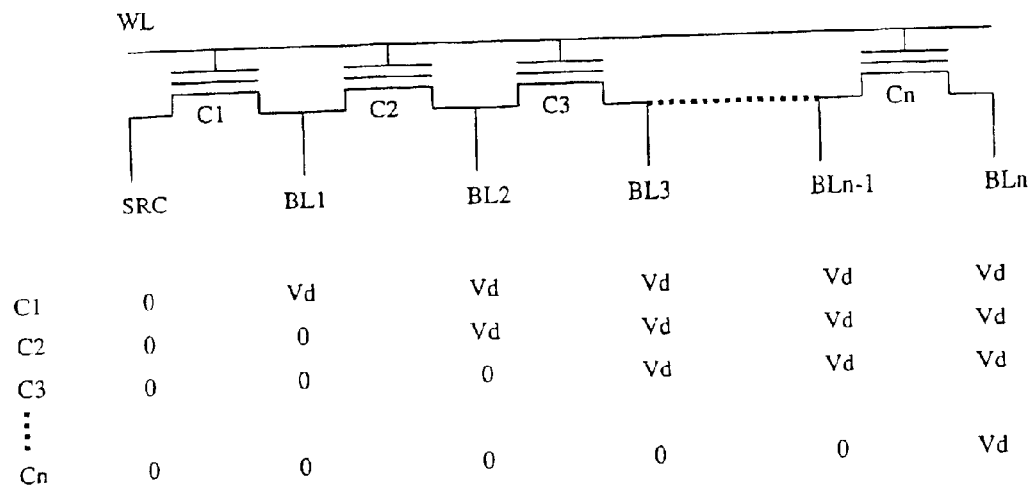
FIG. 1 is an equivalent circuit diagram of a non-volatile semiconductor memory for illustrating a method of writing data in the non-volatile semiconductor memory in accordance with the present invention.
Figure 15:
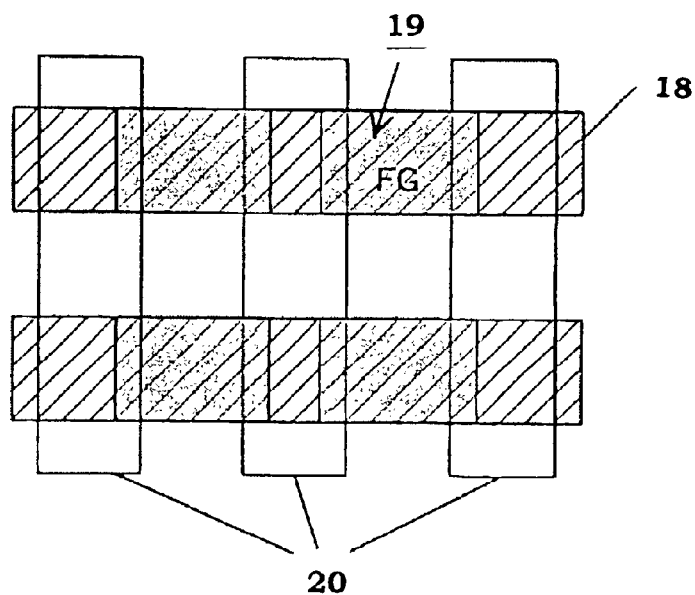
FIG. 15 is a schematic plan view of a prior-art contactless array cell.

In the non-volatile semiconductor memory of the present invention, basically as shown in FIG. 1, non-volatile memory transistors are arranged in a matrix, and a plurality of memory transistors (memory cell: Cn) are connected to one word line WL. Thus the non-volatile semiconductor memory forms substantially the same contactless memory cell array as shown in FIG. 15. The word line extends in the same direction as the channel direction of the memory cells connected to the word line.

In the memory cell array of this construction, as shown in FIG. 1, data is first written into a cell C1 which is the closest to a source (SRC) among the memory cells C1 to Cn on the same word line. The drain of the cell C1 is connected to a bit line BL1. A voltage Vd is applied to BL1 and is also applied to other bit lines BL2 to BLn. Thereby, the data is written only into the cell C1 by channel hot electrons.

After the data is written in the cell C1, data is written into the cell C2 using BL1 as its source. At this time, using the bit line BL2 as the drain, 0V is applied to BL1 and the voltage Vd is applied to the other bit lines BL2 to BLn. Thereby the data is written into the cell C2 by channel hot electrons. Similarly, data is written into the cell C3, and so on. Lastly data is written into the cell Cn which is the farthest from the source.

Thus, in the non-volatile memory in which a plurality of cells are connected to one word line, the data is written into the memory cells sequentially from a source side by a sequential programming system as described above. Thereby the effect of adjacent cells on the source side can be eliminated and the threshold of the memory cells can be accurately controlled.

In contrast, according to an ordinary writing method, all the memory cells of the memory cell array of the above-described construction are erased in an initial state so that their thresholds are set low. All the cells become in an ON-state by raising the potential of the word lines higher than the thresholds of the memory cells.

Figure 2:
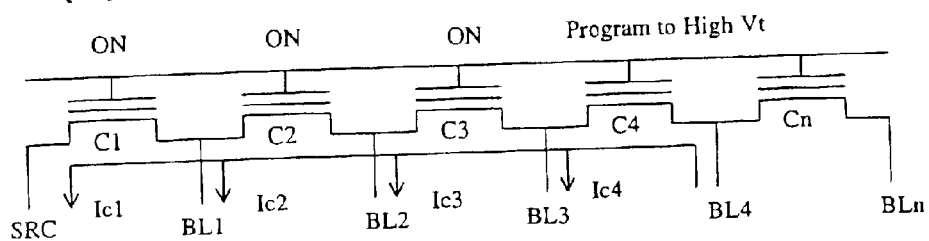
FIGS. 2(a) and 2(b) are equivalent circuit diagrams for illustrating the effect of an adjacent cell when data is written into a non-volatile semiconductor memory by an ordinary method.
Figure 2:
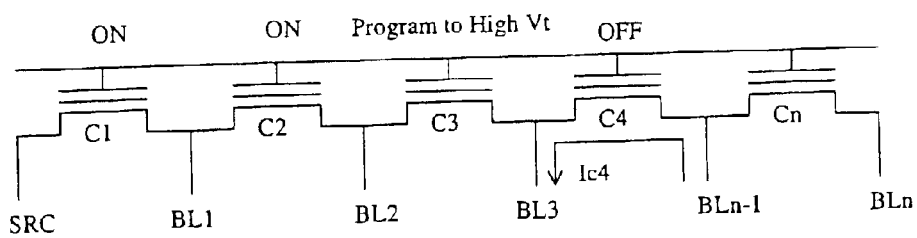

In the state where the thresholds of all the memory cells are set low, first, as shown in FIG. 2(*a*), the cell C4 is written and its threshold is raised. For reading the cell C4, a voltage higher than the thresholds of the memory cells other than the cell C4 is applied to the word line WL. At this time, because the thresholds of the cells C1 to C3 on the source side are lower than the voltage of the word line, the cells C1 to C3 become in the ON-state and a current runs through the cells C1 to C3.

Subsequently, as shown in FIG. 2(*b*), the cell C3 is written and its threshold is raised. When the cell C3 is read in the same manner as described above, the cell C3 turns into an OFF-state, the current does not run from the drain BL4 of the cell C4 toward BL3, BL2, BL1 and SRC on the source side.

Figure 3:
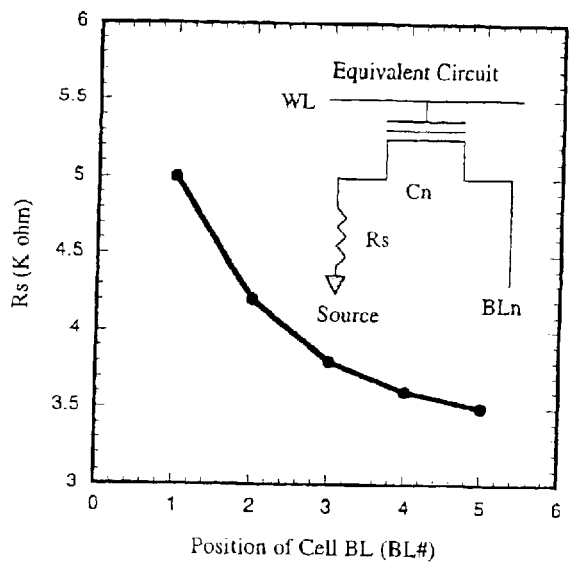
FIG. 3 is a graph showing the effect of an adjacent cell on a source resistance.

FIG. 3 shows the source resistances of the cells C1 to C4 in FIG. 2(*a*). The source resistance of the cell C4 in FIG. 2(*a*) corresponds to the source resistance of C4 in FIG. 3, and the source resistance of the cell C4 in FIG. 2(*b*) corresponds to the source resistance of C1 in FIG. 3.

Therefore, the source resistance of the cell C4 changes by 1.5 kΩ before and after the cell C3 is written. Thus it is understood that the threshold of the cell cannot be controlled accurately and that it is difficult to realize multi-valued operation.

EXAMPLE 2

In the non-volatile semiconductor memory of this example, as shown in FIGS. 4 to 7, a plurality of memory cells are arranged in a matrix. Memory cells lined in a row direction are connected to one word line WL and are divided into two segments. Each segment includes memory cells C1 to C5.

Figure 7:
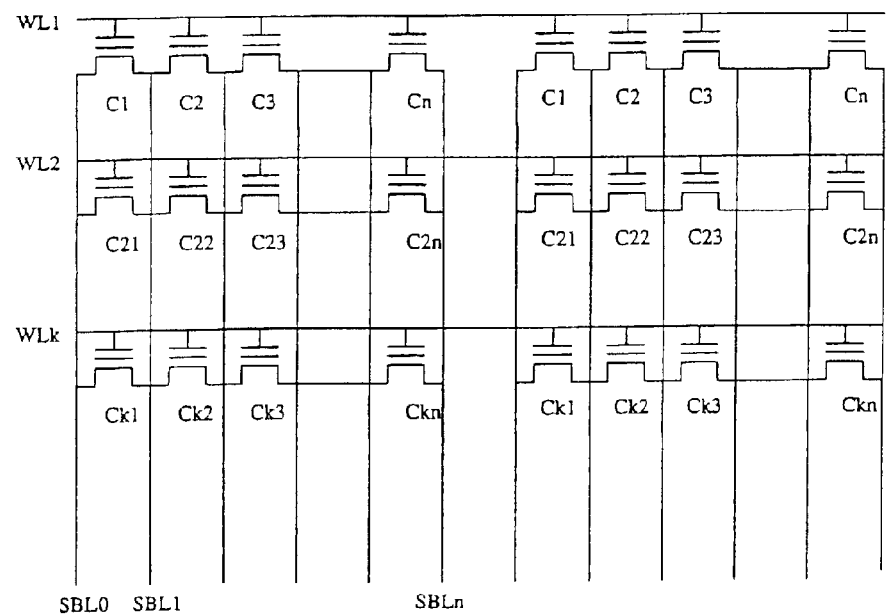
FIG. 7 is an equivalent circuit diagram of a contactless array segmented in a row direction in a non-volatile semiconductor memory in accordance with the present invention.

As regards memory cells lined in a column direction, their sources and drains are connected to the same bit lines, respectively, as shown in FIG. 7. In the same segment, the memory cells share the bit lines with memory cells adjacent thereto in the row direction. The bit lines of each segment are electrically separated from the bit lines of other segment. Preferably, a bit line at one end of one segment is electrically separated from a bit line at an opposed end of a segment adjacent to said one segment by a device isolation region.

Further, two or more segments may be formed in the column direction though not shown in FIG. 7. In such a case, as well known, it is preferable that sub-bit lines of each of the segments in the column direction are electrically separable from sub-bit lines of the other segments in the column direction, for example, by selection transistors or the like. Further, it is preferable that the number of memory cells connected to one sub-bit line is larger than the number of memory cells connected to the same word line in one segment. Thereby, the ratio of the area occupied by the selection transistors to the area of the memory cells can be reduced, and therefore, the memory can be reduced in size.

Figure 4:
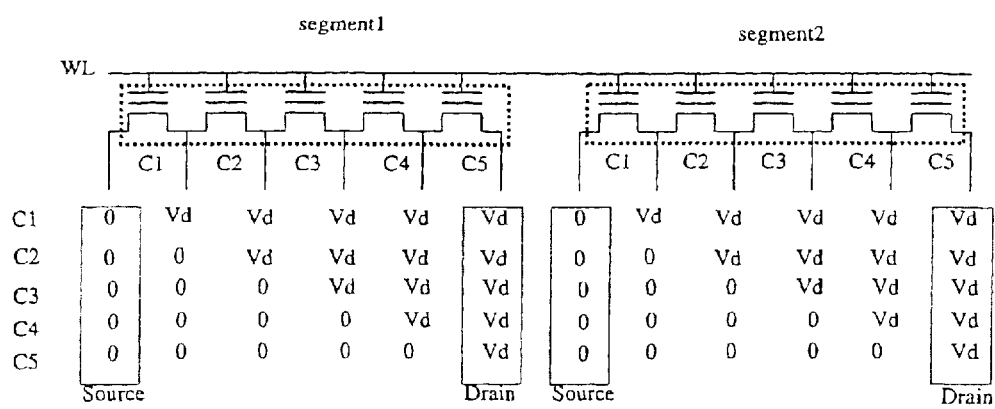
FIG. 4 illustrates how to write an array segmented in a row direction in a non-volatile semiconductor memory in accordance with the present invention.
Figure 5:
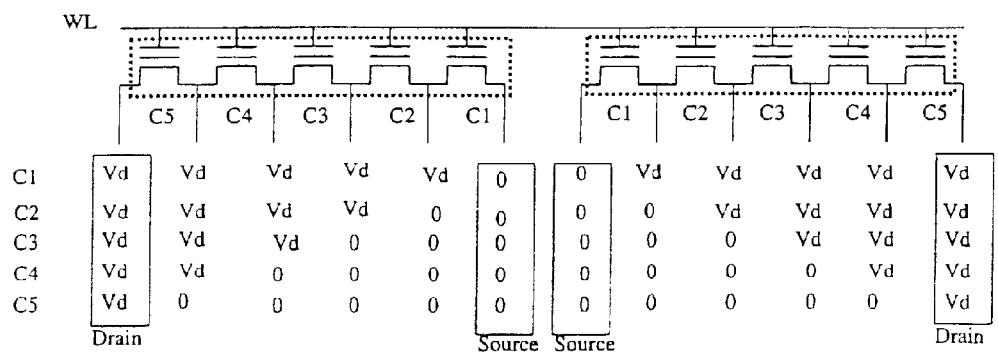
FIG. 5 illustrates how to write another array segmented in a row direction in a non-volatile semiconductor memory in accordance with the present invention.
Figure 6:
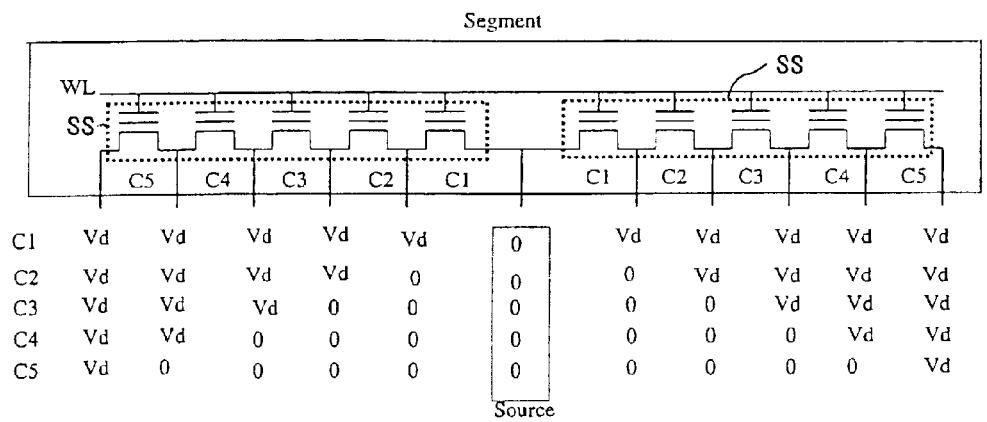
FIG. 6 illustrates how to write still another array segmented in a row direction in a non-volatile semiconductor memory in accordance with the present invention.

FIGS. 4 to 6 illustrate the writing of data into the memory with two segments in the row direction as described above by the sequential programming system.

FIG. 4 illustrates a write method in the case where the source of one segment is opposed to the drain of a segment adjacent thereto. FIG. 5 illustrates a write method in the case where the source of one segment is opposed to the source of a segment adjacent thereto. FIG. 6 illustrates a write method in the case where the source of one segment is shared by segment adjacent thereto.

In the non-volatile semiconductor memory of the present invention, as shown in FIG. 6, one segment may further be divided into a plurality of, e.g., two sub-segments. In this case, two sub-bit lines connected to memory cells in adjacent sub-segments share a main bit line via selection transistors.

Further, in the thus segmented and/or sub-segmented memory cell array, the bit lines may be composed of sub-bit lines and main bit lines of a hierarchical structure as shown in FIGS. 7 to 13.

Referring to FIG. 7, the memory cells are divided into two segments in the direction of the word line, and one segment includes n+1 sub-bit lines SBL. The sub-bit lines SBL are connected to main bit lines MBL (not shown) via selection transistors (not shown) to form a hierarchical structure. The number of word lines of the cells connected to the sub-bit lines is arranged to k (n<k).

This arrangement can decrease the area occupied by the selection transistors with regard to the area of the memory cells, thereby allowing higher integration.

Some examples of connection of the sub-bit lines SBL to the main bit lines MBL are shown in FIGS. 8 to 13.

Figure 8:
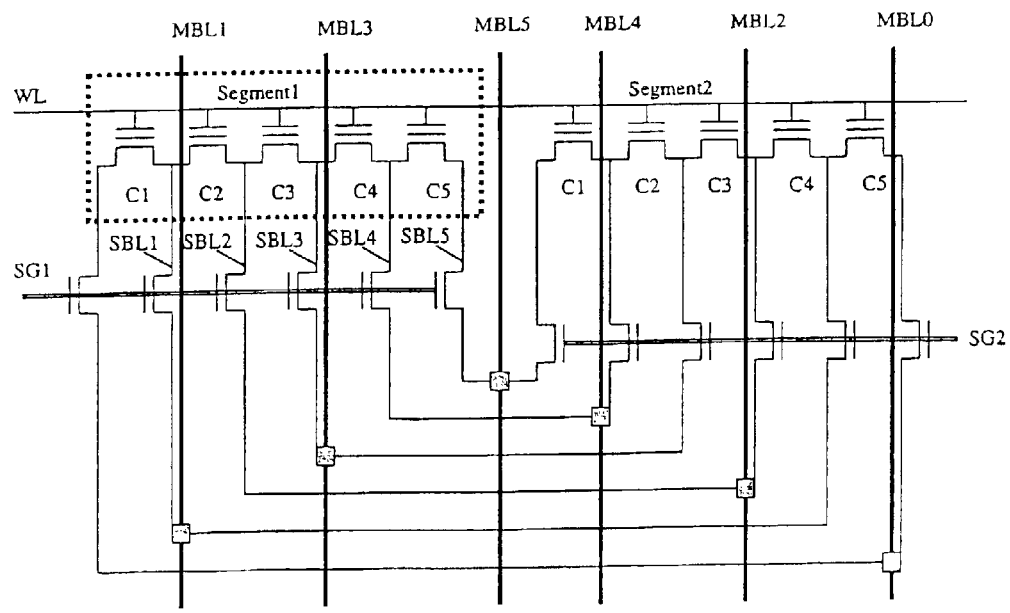
FIG. 8 is an equivalent circuit diagram showing the connection of sub-bit lines and main bit lines in an array segmented in a row direction in a non-volatile semiconductor memory in accordance with the present invention.

Referring to FIG. 8, one main bit line MBL is shared by sub-bit lines SBL of two adjacent segments. These sub-bit lines SBL are connected to the main bit line MBL via selection transistors SG1 and SG2, respectively. Thereby, the same potential can be given to the gates of the selection transistors SG1 connected to the sub-bit lines of the memory cells in the same segment. Also different potentials can be given to adjacent segments by applying different voltages to the gates of the selection transistors SG1 and SG2.

In FIG. 8, two segments share the main bit lines, but three, four, five or more segments may share the main bit lines.

In this construction, by turning on the selection transistors SG1 and turning off the selection transistors SG2, the cells in a segment 1 can be written. At this time, the sub-bit lines SBL of a segment 2 are floating, and the cells in the segment 2 are not written. The cells in the segment 2 can be written by a similar manner. Thereby one-bit data can be written in the two segments.

The memory cell array with this connection structure can be operated by applying voltages shown in Table 1.

TABLE 1

(unit: V)

|  | C1 | C2 | C3 | C4 | C5 |
|---|---|---|---|---|---|
| MBL 0 = SL | 0 | 0 | 0 | 0 | 0 |
| MBL1 | 5 | 0 | 0 | 0 | 0 |
| MBL2 | 5 | 5 | 0 | 0 | 0 |
| MBL3 | 5 | 5 | 5 | 0 | 0 |
| MBL4 | 5 | 5 | 5 | 5 | 0 |
| MBL5 | 5 | 5 | 5 | 5 | 5 |

WL = 10 V, SG1 = 10 V, SG2 = 0 V

However, the voltages to be applied are not limited to those listed in Table 1 and Table 2, as mentioned below, and can be adjusted according to these tables.

Figure 9:
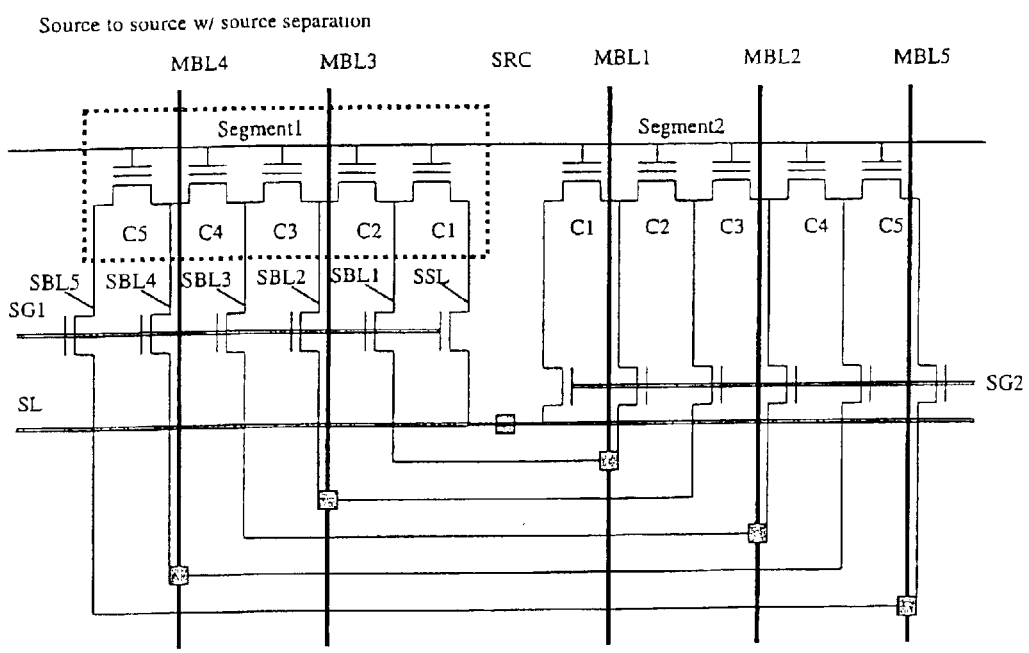
FIG. 9 is an equivalent circuit diagram showing the connection of sub-bit lines and main bit lines in another array segmented in a row direction in a non-volatile semiconductor memory in accordance with the present invention.

Referring to FIG. 9, the sources of two adjacent segments are opposed to each other. Sub-bit lines SBL of the adjacent segments share one main bit line MBL. The sub-bit lines SBL are connected to the main bit line via two selection transistors SG1 and SG2, respectively. A source line SL is shared by different segments connected to the same word line.

The memory cell array with this connection structure can be operated by applying voltages shown in Table 1.

Figure 10:
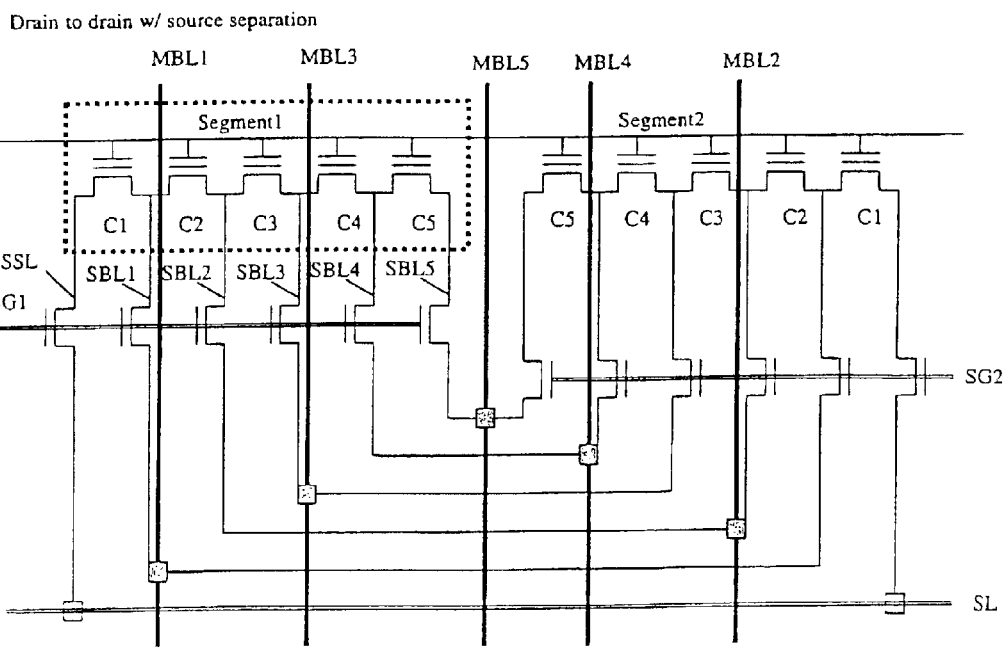
FIG. 10 is an equivalent circuit diagram showing the connection of sub-bit lines and main bit lines in still another array segmented in a row direction in a non-volatile semiconductor memory in accordance with the present invention.

Referring to FIG. 10, the drains of two adjacent segments are opposed to each other. Sub-bit lines SBL of the adjacent segments share one main bit line MBL. The sub-bit lines SBL are connected to the main bit line via two selection transistors SG1 and SG2, respectively. A source line SL is shared by different segments connected to the same word line.

The memory cell array with this connection structure can be operated by applying voltages shown in Table 1.

Figure 11:
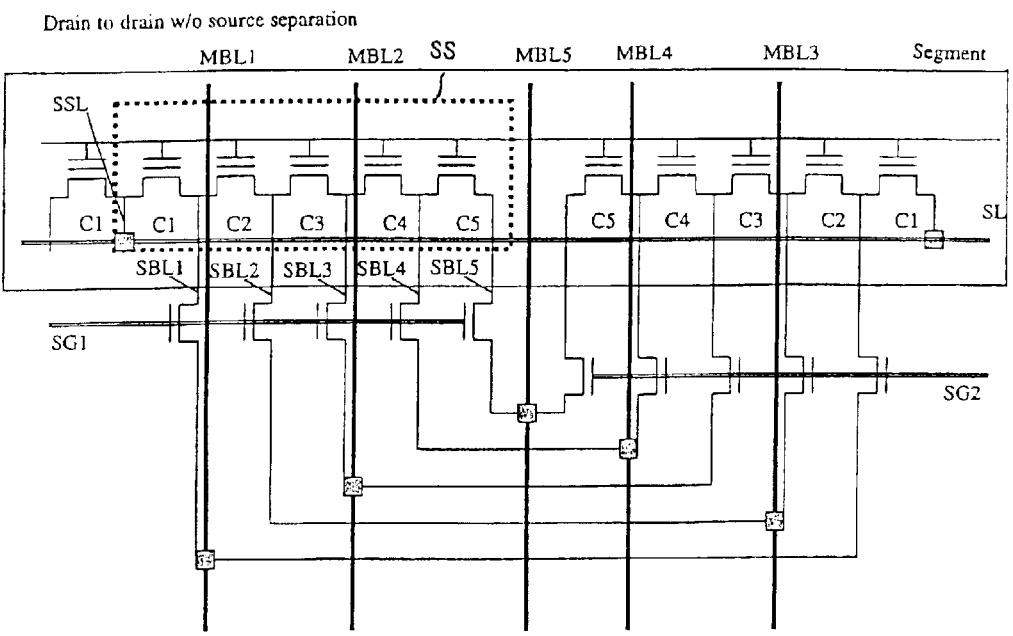
FIG. 11 is an equivalent circuit diagram showing the connection of sub-bit lines and main bit lines in still another array segmented in a row direction in a non-volatile semiconductor memory in accordance with the present invention.

Referring to FIG. 11, the drains of two adjacent segments are opposed to each other. The adjacent segments share a source without intervention of a selection transistor. Sub-bit lines SBL of the adjacent sub-segments share one main bit line MBL. The sub-bit lines SBL are connected to the main bit line via two selection transistors SG1 and SG2, respectively. The source line is shared between different segments.

The memory cell array with this connection structure can be operated by applying voltages shown in Table 1.

Figure 12:
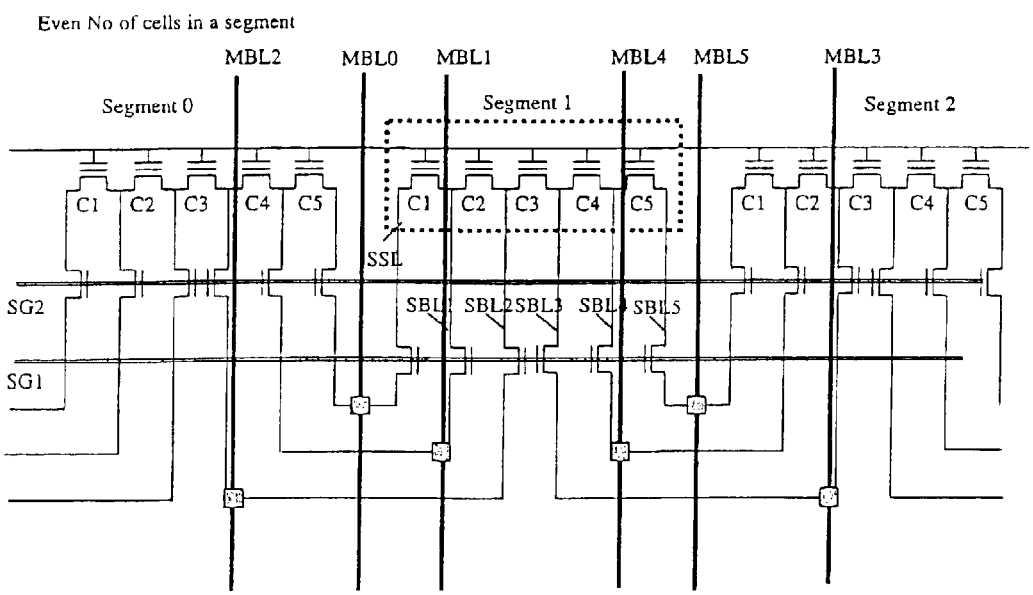
FIG. 12 is an equivalent circuit diagram showing the connection of sub-bit lines and main bit lines in still another array segmented in a row direction in a non-volatile semiconductor memory in accordance with the present invention.

Referring to FIG. 12, one segment shares main bit lines MBL with two adjacent segments. With this construction, one bit data can be written in three segments.

The memory cell array with this connection structure can be operated by applying voltages shown in Table 1.

Figure 13:
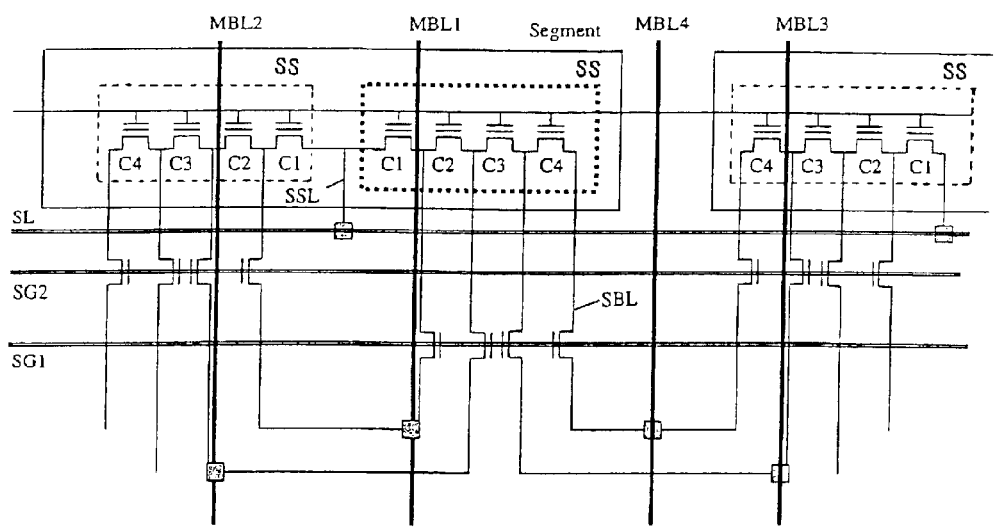
FIG. 13 is an equivalent circuit diagram showing the connection of sub-bit lines and main bit lines in still another array segmented in a row direction in a non-volatile semiconductor memory in accordance with the present invention.
Figure 14:
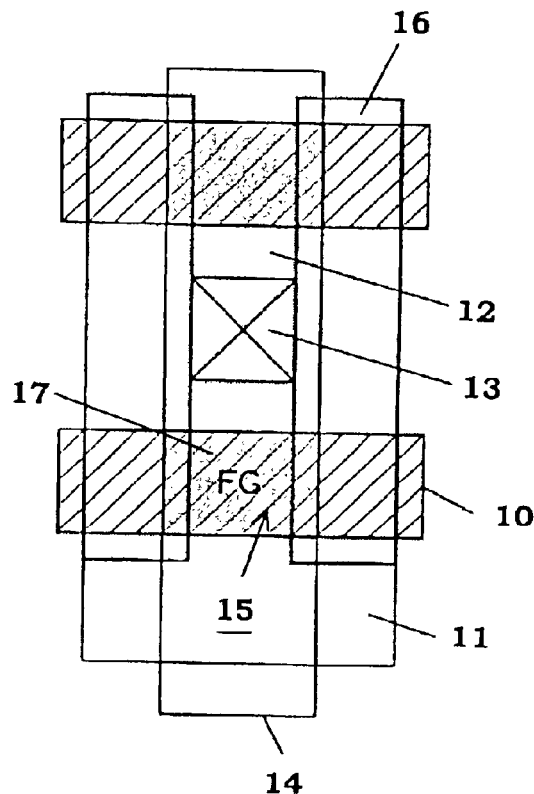
FIG. 14 is a schematic plan view of a prior-art non-volatile NOR-type memory.

Referring to FIG. 13, one segment is composed of two sub-segments. One sub-segment is arranged to have its sources and drains opposed to those of two sub-segments adjacent thereto. The sub-segment shares a source with an adjacent sub-segment without intervention of a selection transistor. That is, the source can be shared between different segments. Further one main bit line MBL is shared by sub-bit lines of the sub-segments. Thereby one bit data can be written in three sub-segments.

The memory cell array with this connection structure can be operated by applying voltages shown in Table 2.

TABLE 2

(unit: V)

|  | C1 | C2 | C3 | C4 |
|---|---|---|---|---|
| MBL 0 = SL | 0 | 0 | 0 | 0 |
| MBL1 | 5 | 0 | 0 | 0 |
| MBL2 | 5 | 5 | 0 | 0 |
| MBL3 | 5 | 5 | 5 | 0 |
| MBL4 | 5 | 5 | 5 | 5 |

WL = 10 V, SG1 = 10 V, SG2 = 0 V

According to the present invention, in the non-volatile semiconductor memory of the contactless array structure, a plurality of memory cells connected to the same word line are written sequentially from a memory cell at one end to a memory cell at the other end. Thereby the area of cells can be decreased while capacity can be significantly increased. Also the threshold can be accurately controlled regardless of the state of adjacent cells. Thus the non-volatile semiconductor memory can be operated with high reliability.

Also, according to the present invention, a plurality of memory cells are arranged in a matrix, and memory cells aligned in the row direction are divided into two or more segments. Thereby the voltage applied to the bit lines of a selected segment can be controlled independently, and the area of a bias generating circuit can be reduced.

Furthermore, since the bit lines are composed of hierarchical sub-bit lines and main bit lines, the pitch width of the main bit lines becomes twice as large as that of a non-hierarchical structure. Thus the degree of freedom in designing the layout of the memory cells can be improved without need to pay much attention to the position of the main-bit lines.

What is claimed is:

1. A non-volatile semiconductor memory comprising a plurality of memory cells arranged in matrix, of which those aligned in a row direction are divided into two or more segments, wherein gates of the memory cells aligned in the row direction are connected to the same word line, sources and drains of memory cells aligned in a column direction are connected to the same bit lines, respectively, in the same segment, bit lines are shared by memory cells adjacent in the row direction, respectively, and the bit lines in each segment are electrically separated from the bit lines in other segment.

2. A memory according to claim 1, wherein a bit line at an end of one of the segments is electrically separated from a bit line at an end of other one of the segments by a device isolation region.

3. A memory according to claim 1, wherein the bit lines are composed of sub-bit lines and at least one main bit line of a hierarchical structure, the sub-bit lines are connected to the sources and drains of the memory cells, and the main bit line is connected in common to two sub-bit lines connected to memory cells in adjacent segments, respectively, via selection transistors.

4. A memory according to claim 3, wherein the segments are further divided into sub-segments, and the main bit line is connected in common to two sub-bit lines connected to memory cells in adjacent sub-segments, respectively, via selection transistors.

5. A memory according to claim 4, wherein a plurality of main bit lines are connected to the memory cells in one segment or sub-segment, some of the main bit lines are connected in common to memory cells in a segment or sub-segment adjacent to one side of said one segment or sub-segment and the rest of the main bit lines are connected in common to memory cells in a segment or sub-segment adjacent to another side of said one segment or sub-segment.

6. A memory according to claim 4, wherein a plurality of main bit lines are connected to the memory cells in each of the segments or sub-segments, some of the main bit lines in one segment or sub-segment are connected in common to memory cells in a segment or sub-segment are connected in common to memory cells in a segment or sub-segment adjacent to one side of said one segment or sub-segment and the rest of the main bit lines in said one segment or sub-segment are connected in common to memory cells in a segment or sub-segment adjacent to another side of said one segment or sub-segment.

7. A memory according to claim 3, wherein the closest bit lines or the farthest bit lines of adjacent segments are connected to a source line via selection transistors, and the source line is shared by a plurality of segments or sub-segments connected to the same word line.

8. A memory according to claim 3, wherein in adjacent segments or sub-segments arranged in the row direction, a bit line is shared between a memory cell of one of the adjacent segments or sub-segments, the memory cell being the closest to the other one of the adjacent segments or sub-segments, and a memory cell of said other one of the adjacent segments or sub-segments, the memory cell being closest to said one of the adjacent segments or sub-segments.

9. A memory according to claim 8, wherein in adjacent segments or sub-segments arranged in the row direction, a bit line is shared between the closest memory cells of the adjacent segments or sub-segments.

10. A memory according to claim 3, wherein wiring is provided so that the same potential is given to the gates of the selection transistors connected to the sub-hit lines of the memory cells of the same segment or sub-segment.

11. A memory according to claim 10, wherein wiring is provided so that different potentials are given to the gates of the selection transistors of adjacent segments or sub-segments.

12. A memory according to claim 3, wherein the number of memory cells connected to one sub-bit line is larger than the number of memory cells connected to the same word line in one segment or sub-segment.

13. A memory according to claim 1, wherein two or more segments are further formed in the column direction, and the bit lines of each of the segments in the column direction are electrically separable from the bit lines of other segments in the column direction.

14. A method of writing a non-volatile semiconductor memory as set forth in claim 1, wherein only one-bit data is written in two segments at the same time.

15. A method of writing a non-volatile semiconductor memory as set forth in claim 1, wherein only one-bit data is written in three segments at the same time.

16. A method of writing a non-volatile semiconductor memory as set forth in claim 1, wherein data is written by channel hot elements.

* * * * *